US012701932B2

(12) United States Patent
Liao et al.

(10) Patent No.: US 12,701,932 B2
(45) Date of Patent: Aug. 4, 2026

(54) SEMICONDUCTOR DEVICE STRUCTURE AND MANUFACTURING METHOD THEREOF

(71) Applicant: Taiwan Semiconductor Manufacturing Company, Ltd., Hsinchu (TW)

(72) Inventors: Kun-Yen Liao, Taipei (TW); Ming-Hsien Lin, Hsinchu County (TW); Yung-Chih Wang, Taoyuan (TW); Hsin-Ping Chen, Hsinchu County (TW); Tsu-Chun Kuo, Hsinchu County (TW); Meng-Pei Lu, Hsinchu (TW); Cheng-Chin Lee, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 382 days.

(21) Appl. No.: 18/421,877

(22) Filed: Jan. 24, 2024

(65) Prior Publication Data

US 2025/0239449 A1 Jul. 24, 2025

(51) Int. Cl.
H10P 14/20 (2026.01)
H10P 14/22 (2026.01)
(Continued)

(52) U.S. Cl.
CPC .......... H10P 14/3461 (2026.01); H10P 14/22 (2026.01); H10P 14/24 (2026.01);
(Continued)

(58) Field of Classification Search
CPC ...... H10P 14/3461; H10P 14/22; H10P 14/24; H10P 14/2903; H10P 14/2908;
(Continued)

(56) References Cited

U.S. PATENT DOCUMENTS

| | | | | |
|---|---|---|---|---|
| 2008/0128812 | A1* | 6/2008 | Bernstein | H10W 20/023 |
| | | | | 257/E21.703 |
| 2014/0332749 | A1* | 11/2014 | Yokoyama | H10D 86/00 |
| | | | | 257/288 |

(Continued)

FOREIGN PATENT DOCUMENTS

| | | |
|---|---|---|
| CN | 113241378 | 8/2021 |
| CN | 113889410 | 1/2022 |
| CN | 115763221 | 3/2023 |

OTHER PUBLICATIONS

"Office action of Taiwan Counterpart Application", issued on Nov. 6, 2024, p. 1-p. 4.

*Primary Examiner* — Bitew A Dinke
(74) *Attorney, Agent, or Firm* — JCIPRNET

(57) ABSTRACT

A manufacturing method for a semiconductor device structure and the semiconductor device structure are disclosed. The method includes forming backside connection structures by sequentially forming heat transfer layers stacked upon one another and backside metallization structures sandwiched between the heat transfer layers. The formation of at least one heat transfer layer involves performing an annealing process to turn an insulating material layer into an insulating nanostructured material layer with nano grains and dopants distributed along grain boundaries of the nano grains.

20 Claims, 10 Drawing Sheets

(51) Int. Cl.

| | |
|---|---|
| *H10P 14/24* | (2026.01) |
| *H10P 52/40* | (2026.01) |
| *H10W 20/00* | (2026.01) |
| *H10W 20/41* | (2026.01) |
| *H10W 70/63* | (2026.01) |

(52) U.S. Cl.
CPC ...... *H10P 14/2903* (2026.01); *H10P 14/2908* (2026.01); *H10P 52/402* (2026.01); *H10W 20/074* (2026.01); *H10W 20/427* (2026.01); *H10W 70/635* (2026.01)

(58) Field of Classification Search
CPC . H10P 52/402; H10W 20/074; H10W 20/427; H10W 70/635; H10W 20/023; H10W 20/0698; H10W 20/20; H10W 74/114; H10W 20/40–498
See application file for complete search history.

(56) References Cited

U.S. PATENT DOCUMENTS

| | | | | |
|---|---|---|---|---|
| 2014/0367753 A1* | 12/2014 | Huang | ................. | H10D 30/021 |
| | | | | 438/294 |
| 2015/0060967 A1* | 3/2015 | Yokoyama | .............. | H10F 39/18 |
| | | | | 257/295 |
| 2018/0277708 A1* | 9/2018 | Albin | .................... | H10F 71/125 |
| 2019/0157310 A1* | 5/2019 | Glass | ................... | H10D 86/215 |
| 2025/0140644 A1* | 5/2025 | Lin | .................... | H10W 20/097 |

* cited by examiner

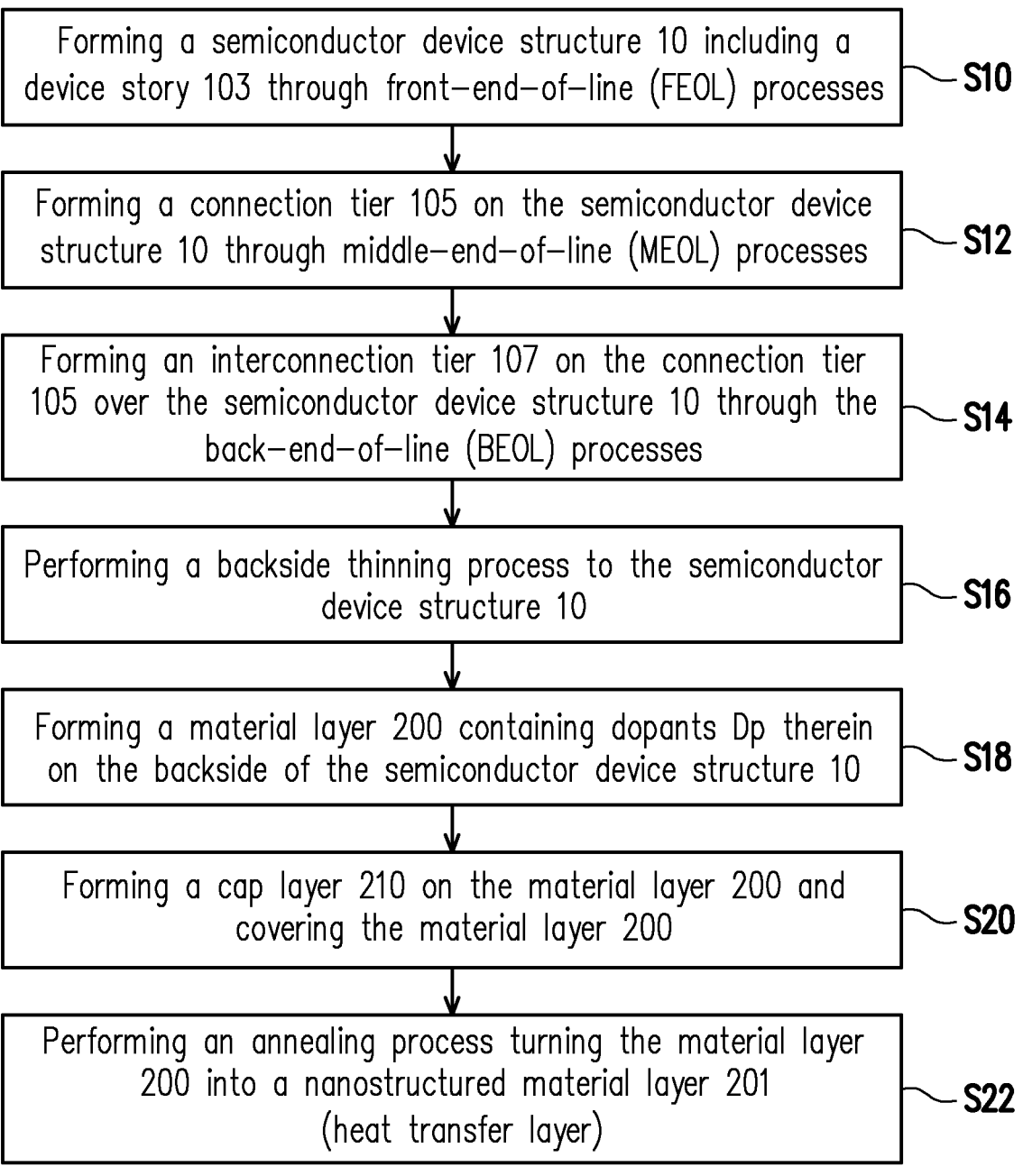

Forming a semiconductor device structure 10 including a device story 103 through front-end-of-line (FEOL) processes    S10

Forming a connection tier 105 on the semiconductor device structure 10 through middle-end-of-line (MEOL) processes    S12

Forming an interconnection tier 107 on the connection tier 105 over the semiconductor device structure 10 through the back-end-of-line (BEOL) processes    S14

Performing a backside thinning process to the semiconductor device structure 10    S16

Forming a material layer 200 containing dopants Dp therein on the backside of the semiconductor device structure 10    S18

Forming a cap layer 210 on the material layer 200 and covering the material layer 200    S20

Performing an annealing process turning the material layer 200 into a nanostructured material layer 201 (heat transfer layer)    S22

FIG. 10

SEMICONDUCTOR DEVICE STRUCTURE AND MANUFACTURING METHOD THEREOF

BACKGROUND

Technological advances in the semiconductor integrated circuit (IC) industry lead to smaller dimensions and more complex design in IC structures.

BRIEF DESCRIPTION OF THE DRAWINGS

FIG. 10 is an exemplary flow chart showing the process steps of the manufacturing method of a semiconductor device structure in accordance with some embodiments of the present disclosure.

DETAILED DESCRIPTION

Figure 1:
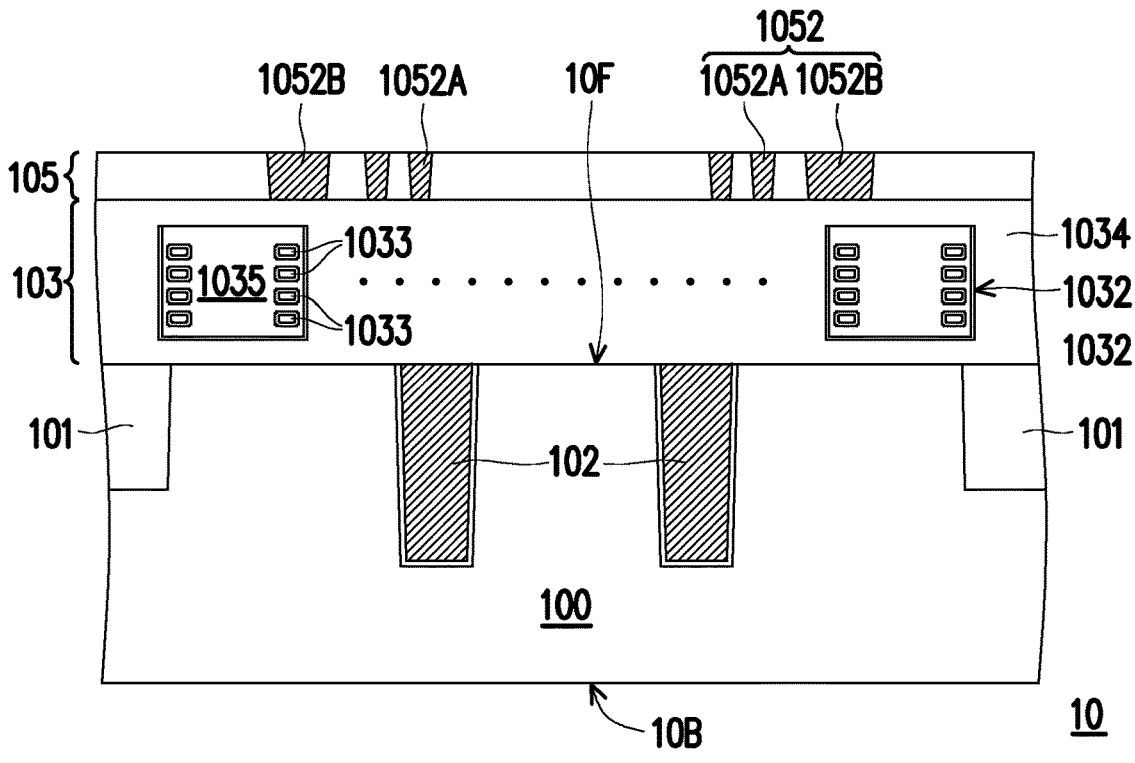
FIGS. 1-5 illustrate schematic cross-sectional views of various stages in a manufacturing method for a semiconductor device structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Some embodiments described herein provide a semiconductor device including a backside heat transfer structure with at least one or more layers of an insulating material (electrical insulator) having high thermal conductivity for assisting heat transfer and heat dissipation for backside power rails or other backside power distribution lines or delivery network. Through laser annealing along with in-situ doping, high quality insulating layer(s) having large grain sizes and high thermal conductivity can be formed at the backside portions of the semiconductor devices. By way of such formation process(es), high thermal conductivity insulating layers are formed as parts of the backside heat transfer structure to offer satisfactory effective thermal conductivity for backside power rails and to lower the maximum temperature at the backside power scheme, leading to elevated heat transfer efficiency and good device performance for the semiconductor devices. In addition, the formation of the high thermal conductivity dielectric layers is compatible with back-end-of-line (BOEL) processes and/or the manufacturing processes of the backside structure. Accordingly, highly efficient heat dissipation scheme is achieved for the semiconductor devices through straightforward processes compatible with presently available manufacturing processes.

Figure 2:
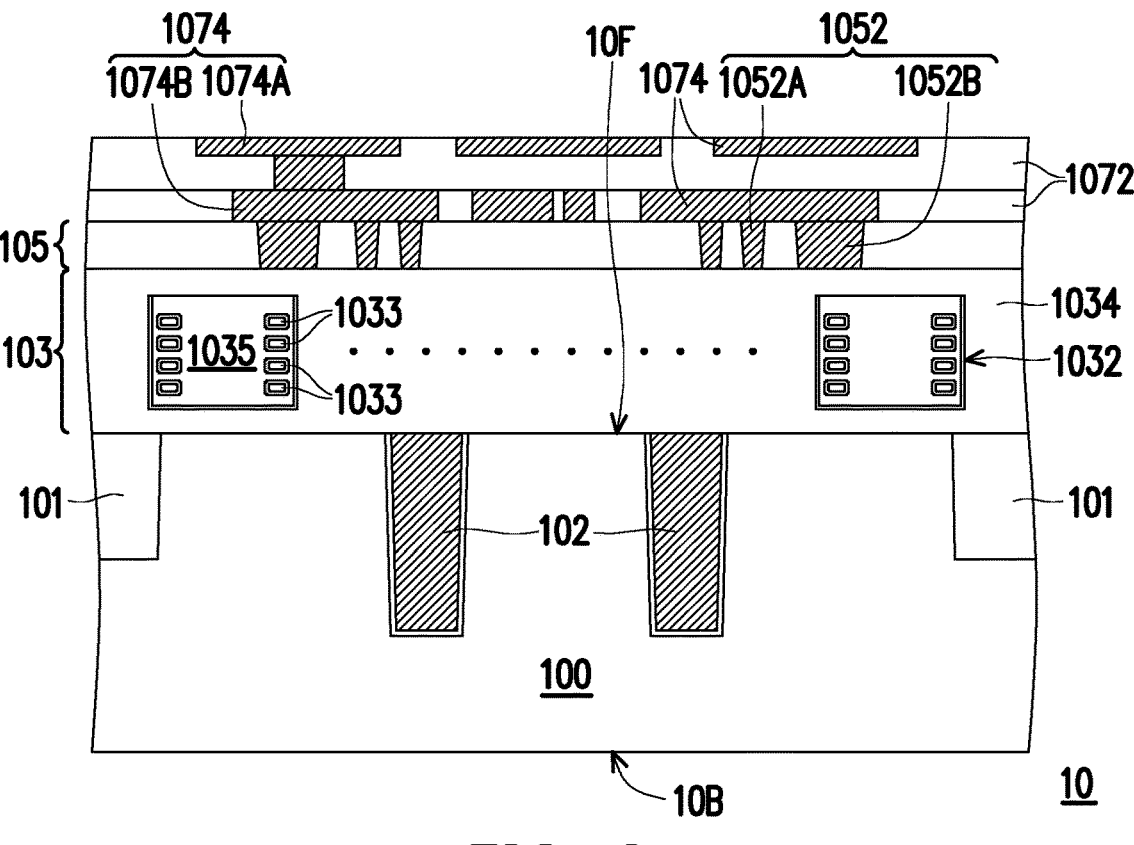
Figure 3:
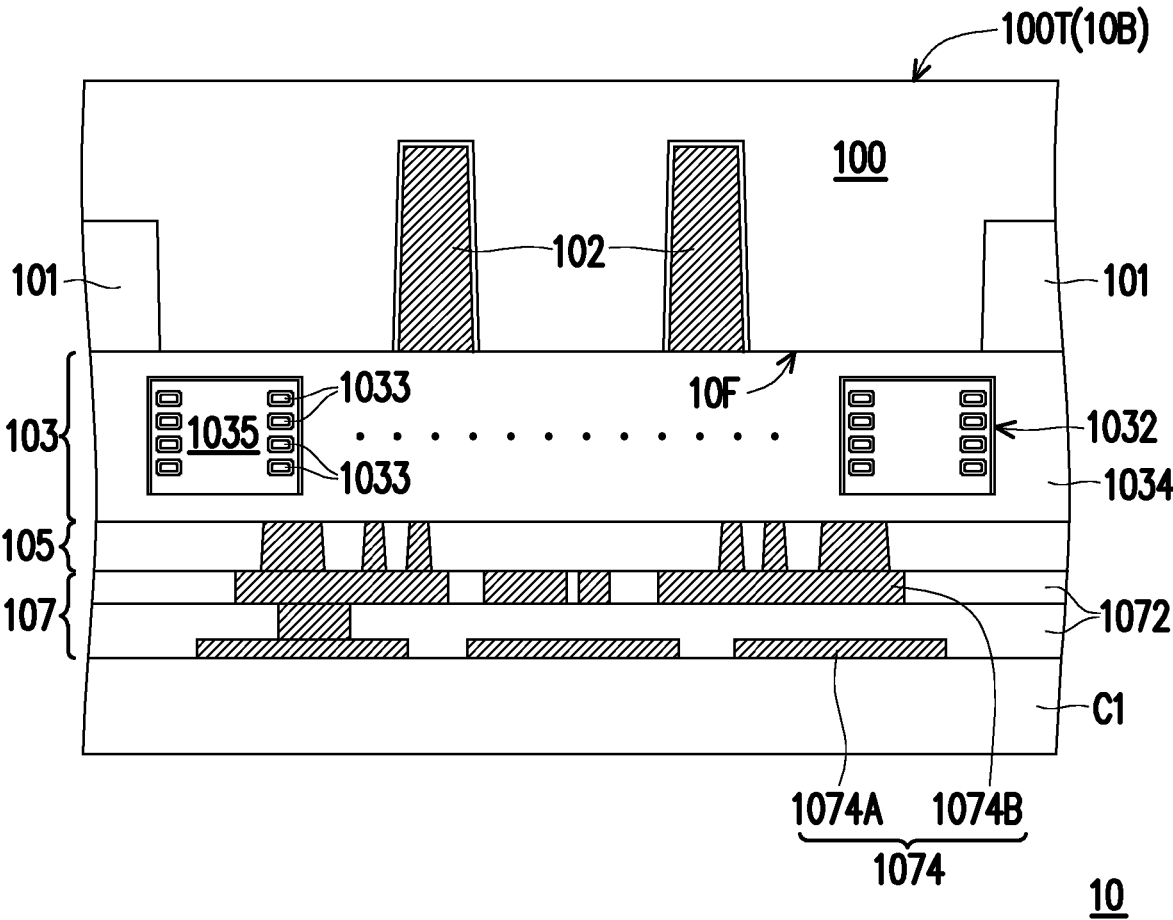
Figure 4:
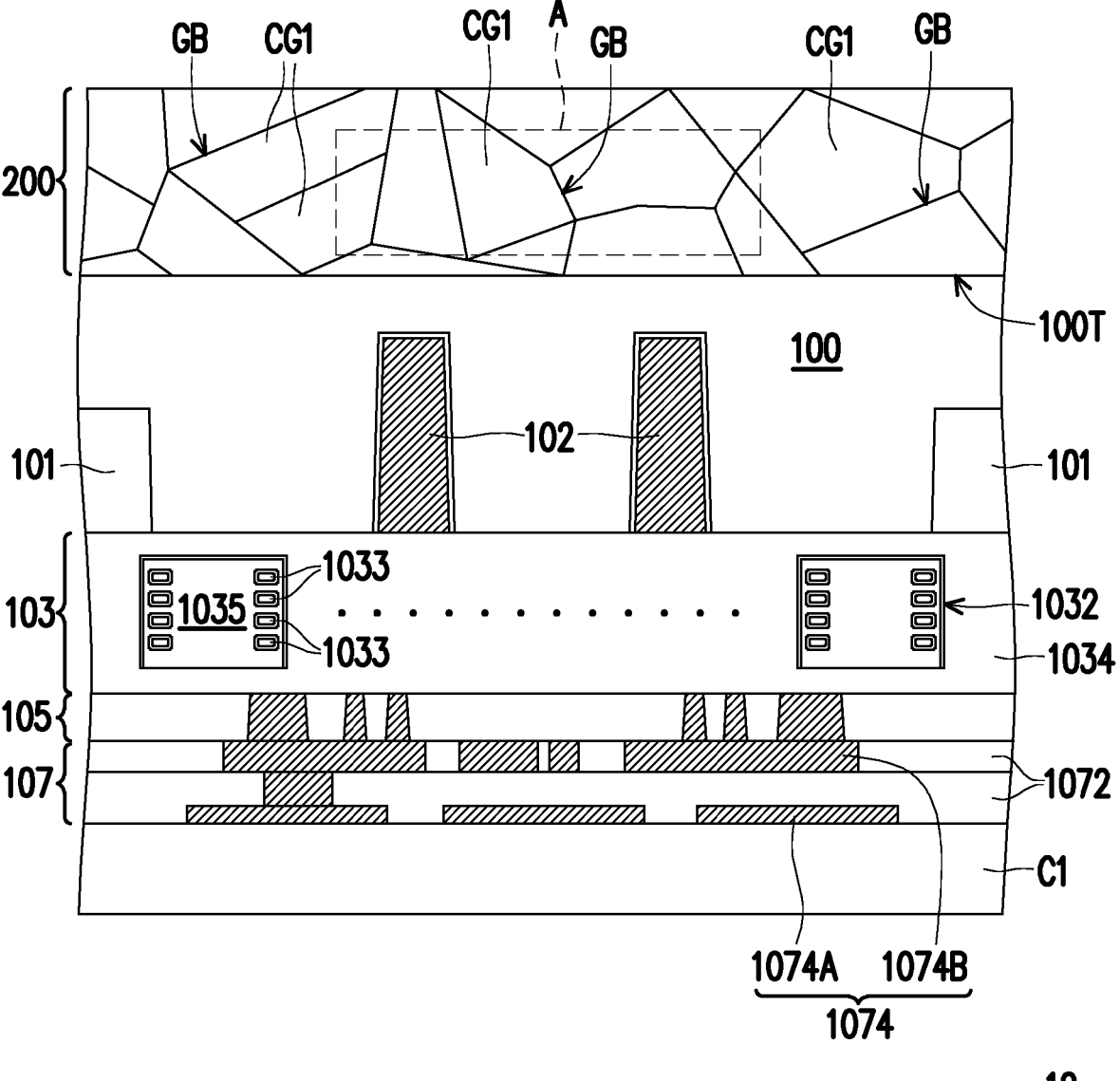
Figure 5:
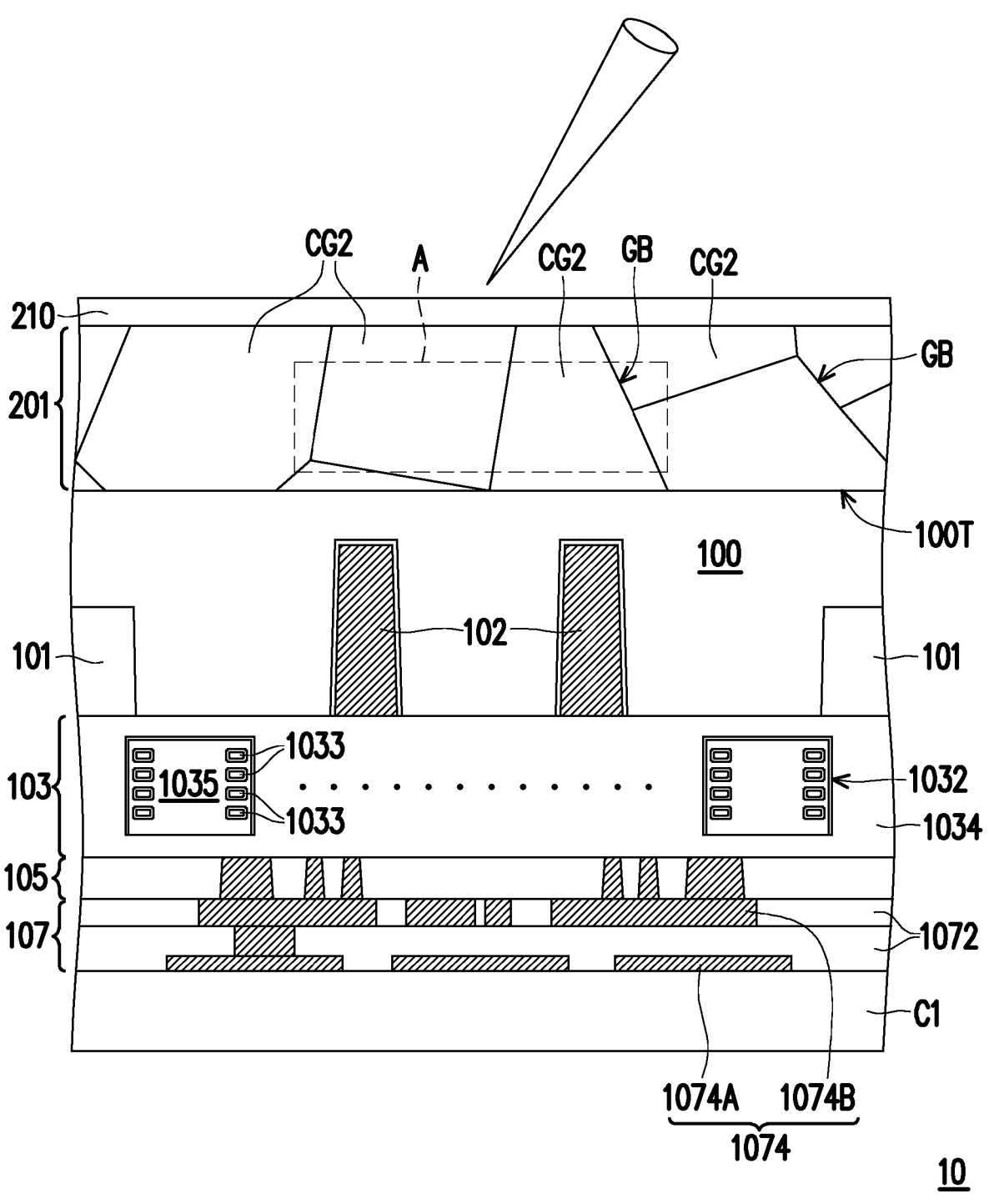
Figure 6:
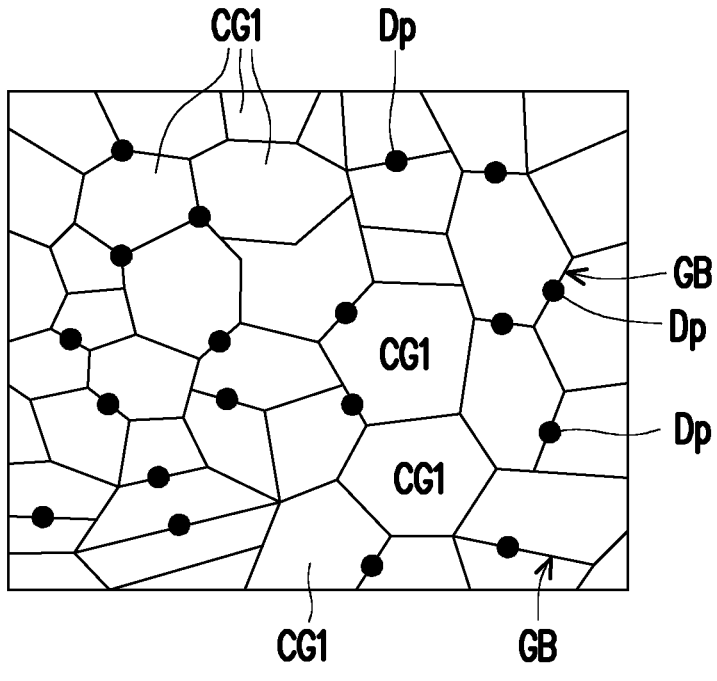
FIG. 6 and FIG. 7 are schematic enlarged views of portions of the material layer within the semiconductor device as shown in FIG. 4 and FIG. 5 respectively according to some embodiments of the present disclosure.
Figure 7:
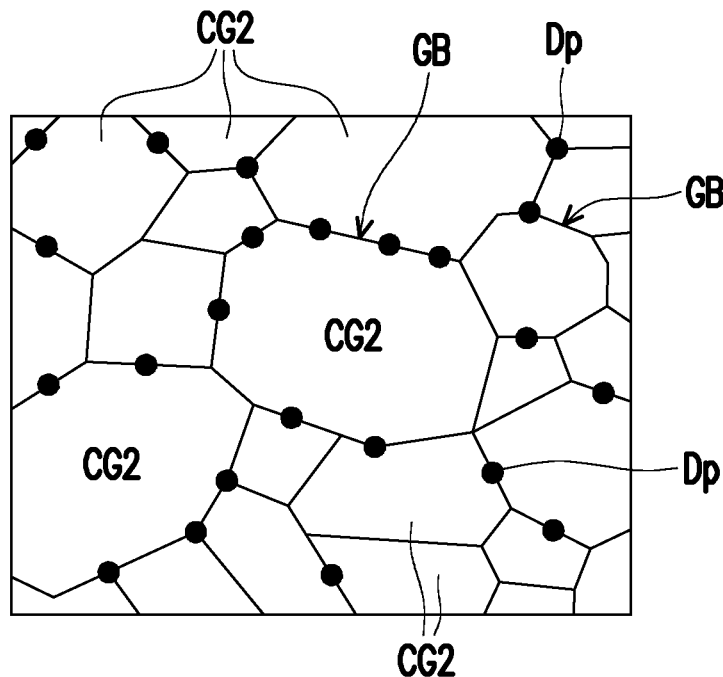

From FIG. 1 through FIG. 5, schematic cross-sectional views of a portion of a semiconductor device structure at successive intermediate stages of a manufacturing method are shown, according to some embodiments of the present disclosure. FIG. 6 and FIG. 7 are schematic enlarged views of portions of the material layer within the semiconductor device structure as shown in FIG. 4 and FIG. 5 respectively according to some embodiments of the present disclosure. FIG. 10 is an exemplary flow chart showing the process steps of the manufacturing method of a semiconductor device structure in accordance with some embodiments of the present disclosure.

Figure 8:
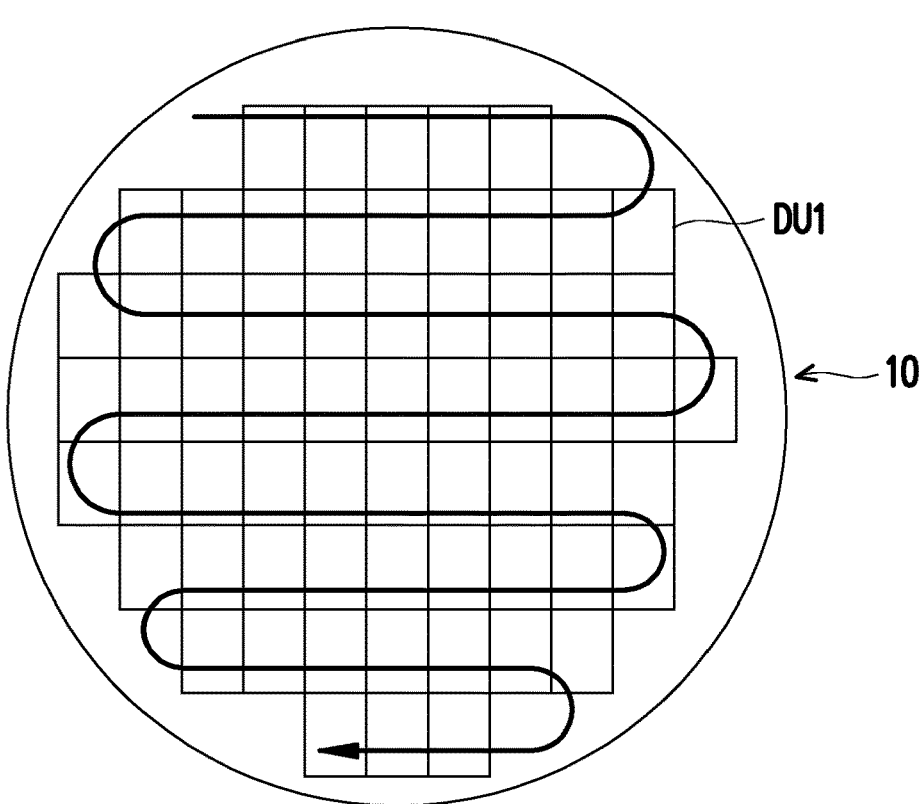
FIG. 8 is a schematic top view of an exemplary structure of the semiconductor device structure showing the scanning direction in view of multiple die units in accordance with some embodiments of the present disclosure.

Referring to FIG. 1, in some embodiments, a semiconductor device structure 10 is provided. In some embodiments, the semiconductor device structure 10 includes a semiconductor wafer. For example, the semiconductor wafer is a silicon wafer, or a bulk wafer made of other semiconductor materials such as III-V semiconductor materials such as gallium nitride (GaN) or gallium arsenide (GaAs). In some embodiments, the semiconductor device structure 10 may be considered to have a plurality of die units or semiconductor dies before dicing or singulation. In FIG. 1, only a portion of the semiconductor device structure 10 including at least one die unit is shown. Referring to FIG. 8, the schematic top view of the semiconductor device structure 10 is shown with multiple die units DU1. It is understood that the number of the die units or semiconductor dies is merely exemplary. In some embodiments, the die units DU1 are or include different types of dies with different functions. In some embodiments, the die units DU1 are or include the same type of dies or dies of the same functions.

According to the embodiments, in FIG. 1, the semiconductor device structure 10 includes a semiconductor substrate 100 having isolation regions 101 formed therein and through vias 102 penetrating into the semiconductor substrate 100. The semiconductor device structure also includes at least one device layer 103 formed on a frontside surface 10F of the semiconductor substrate 100, over the isolation structures 101 and over the semiconductor substrate 100. In some embodiments, the semiconductor substrate 100 may be a monocrystalline semiconductor substrate such as a silicon substrate, a silicon-on-insulator (SOI) substrate, a germanium substrate, or a germanium-on-insulator (GOI) substrate. In some embodiments, the semiconductor substrate 100 includes an elemental semiconductor such as germanium; a suitable compound semiconductor such as gallium arsenide (GaAs), silicon carbide (SiC), indium arsenide (InAs), or indium phosphide (InP), or a suitable alloy semiconductor such as silicon-germanium (SiGe), gallium arsenic phosphide (GaAsP), or gallium indium phosphide (GaInP). In some embodiments, the substrate 100 includes an oxide semiconductor material such as indium tin oxide (ITO). In some embodiments, the isolation regions 101 include shallow trench isolation (STI) structures. In some embodiments, through vias 102 buried within and penetrating into the semiconductor substrate 100 include through semiconductor vias (TSVs).

In some embodiments, referring to FIG. 1, the device layer 103 is formed to include multiple transistors 1032 covered by a dielectric material 1034. In certain embodiments, the device layer 103 includes semiconductor transistors 1032 formed in or on the semiconductor substrate 100 through the front-end-of-line (FEOL) processes. In certain embodiments, the transistors 1032 include one or more types of transistors such as field effect transistors (FETs) including fin-type FETs, nanosheet FETs, nanowire FETs, gate-all-around FETs, fork-sheet FETs, or complimentary FETs, and the configurations of the transistor structures may be different depending on design requirements. In some embodiments, the device layer 103 may further include other active devices and/or passive devices, such as capacitors, resistors, diodes, photo-diodes, sensors, inductors or fuses. In one embodiment, the transistor 1032 is illustrated as a nano-sheet FET as an exemplary structure, and the nano-sheet FET includes at least nanosheets 1033 as channels and gate 1035 around the nano-sheets 1033. Referring to FIG. 1, two transistors are shown (along with ellipsis dots representing the omitted multiple transistors or devices) to represent multiple transistors for illustration purposes, but the number of the transistors is not limited by the figures. It is also understood that the type(s) or configuration(s) of the transistors included in the transistors 1032 are not limited by the embodiments or figures shown herein. In some embodiments, these through vias 102 buried in the semiconductor substrate 100 are considered as backside vias electrically connected with the transistors 1032. That is, the through vias 102 that are located at the backside of the transistors 1032 function as part of the backside electrical connection structure of the transistors 1032 (or the device layer 103).

In some embodiments, referring to FIG. 1, a connection tier 105 is formed on the device layer 103 above the semiconductor substrate 100. The connection tier 105 is formed with more than one or multiple contacts 1052 configured as vias 1052A and plugs 1052B. Even though not expressly shown in the figures, it is understood that some or all of the contacts 1052 of the connection tier 105 are electrically connected with the transistors 1032 in the device layer 103, and the transistors 1032 are electrically connected with one another through the connection tier 105. In certain embodiments, the contacts 1052 are metallic contacts, and the materials of the contacts include tungsten (W), tungsten alloys, titanium (Ti), tantalum (Ta), cobalt (Co), nickel (Ni), nitrides thereof, or combinations thereof.

Referring to FIG. 2, in some embodiments, following the formation of the connection tier 105, an interconnection tier 107 is formed over the connection tier 105 above the device layer 103. In some embodiments, the interconnection tier 107 includes inter-dielectric layers 1072 and metallization structures 1074 formed in-between the inter-dielectric layers 1072. In exemplary embodiments, the metallization structures 1074 are inter-connected, some of the transistors 1032 are electrically connected with the metallization structures 1074, and some of the transistors 1032 or semiconductor devices are electrically inter-connected with one another through the contacts 1052 and the metallization structures 1074.

As shown in FIG. 2, in certain embodiments, the metallization structures 1074 are embedded within the inter-dielectric layers 1072 and sandwiched between the inter-dielectric layers 1072 over the connection tier 105. In some embodiments, the metallization structures 1074 include multiple metallization layers of interconnect structures, including interconnected metal lines, vias and contact pads. In some embodiments, the metallization structures 1074 at least include electrically inter-connected top metallization layer(s) 1074A and bottom metallization layer(s) 1074B, and the metallization structures 1074 are electrically connected with the connection tier 105 and the device layer 103. In some embodiments, the top metallization layer(s) 1074A includes top metal lines and vias, and the bottom metallization layer(s) 1074B includes bottom metal lines and traces. The metallization structures 1074 shown herein are merely for illustrative purposes, and the metallization structures 1074 may include other configurations and may include one or more through vias and/or damascene structures. The disclosure does not limit the number of layers of the metallization layers and the number of sublayers included in the inter-dielectric layers 1072, and the number of the layers or sublayers illustrated in the figures is merely exemplary. Additional layers such as barrier layers, etch stop layers may also be formed in between the layers or sublayers thereof.

In certain embodiments, the materials of the metallization structures 1074 include aluminum (Al), aluminum alloys, copper (Cu), copper alloys, titanium (Ti), tantalum (Ta), cobalt (Co), nickel (Ni), tungsten (W), nitrides thereof, or combinations thereof. In some embodiments, the metallization structures 1074 including the top and bottom metallization layers 1074A, 1074B and parts formed in-between are formed from the same metallization processes and are made of the same metal materials. In some embodiments, the metallization structures 1074 are made of copper or copper alloys. In some embodiments, the materials of the inter-dielectric layers 1072 include silicon oxide, a spin-on dielectric material, a low-k dielectric material or a combination thereof. In some embodiments, the insulative inter-dielectric layers 1072 include low-k dielectric layers. Examples include borophosphosilicate glass (BPSG), phosphorosilicate glass (PSG), amorphous fluorinated carbon, parylene, BCB (bis-benzocyclobutenes), polyimide, flare, Xerogel, Aerogel, hydrogen silsesquioxane (HSQ), fluorinated silicon oxide (SiOF), or a combination thereof.

In some embodiments, the connection tier 105 and the interconnection tier 107 are formed through the middle-end-of-line (MEOL) processes and the back-end-of-line (BEOL) processes.

Referring to FIG. 3, in some embodiments, the semiconductor device structure 10 is turned upside down (flipped) and placed on a carrier structure C1, so that the interconnection tier 107 faces the carrier structure C1. In some embodiments, the carrier structure C1 is a carrier wafer or a sacrificial semiconductor wafer. As seen in FIG. 3, the top metallization layer(s) 1074A of the interconnection tier 107 is in direct contact with the carrier structure C1. Optionally, fusion bonding films may be formed between the semiconductor device structure 10 and the carrier structure C1, and the semiconductor device structure 10 may be attached with the carrier structure C1 though fusion bonding. After flipping the semiconductor device structure 10, the semiconductor substrate 100 including conductive through vias 102 is located above the connection tier 105 and the interconnection tier 107, and the backside surface 10B of the semiconductor substrate 100 faces upward and is exposed. Afterwards, a backside thinning process is performed to the exposed surface 10B (the backside) of the semiconductor substrate 100 of the semiconductor device structure 10, and the semiconductor substrate 100 is partially removed (thinned down) but the conductive through vias 102 are still embedded within the semiconductor substrate 100 without being exposed from the treated (thinned) surface 100T of the semiconductor substrate 100, as seen in FIG. 3. In some embodiments, the thinning process includes a polishing process, an etching process, or a combination thereof. Alternatively, the thinning process may partially remove (thin down) the semiconductor substrate 100 to expose the conductive through vias 102.

Referring to FIG. 4, in some embodiments, a material layer 200 is formed on the surface 100T over the semiconductor substrate 100. In some embodiments, the material layer 200 is formed of an insulating material, and is formed by performing a low-temperature deposition process along with a doping process either sequentially or simultaneously. In certain embodiments, the material layer 200 is formed by deposition with in-situ doping. In some embodiments, the material layer 200 may be fabricated to a suitable thickness through the deposition process such as chemical vapor deposition (CVD) (e.g. plasma-enhanced CVD (PECVD), low-pressure CVD (LPCVD), sub-atmosphere CVD (SACVD)), or physical vapor deposition (e.g. sputtering, e-beam evaporation) or other suitable methods. In some embodiments, the deposition process for forming the material layer 200 is a low-temperature deposition process performed under a reaction temperature lower than 400 degrees Celsius or lower than about 425 degrees Celsius, which is compatible with back-end-of-line (BEOL) processes.

In some embodiments, the insulating material of the material layer 200 includes diamond, crystalline (polycrystalline or monocrystalline) aluminum nitride (AlN), crystalline silicon carbide (SiC), and crystalline boron nitride (BN). In some embodiments, the dopants used in the doping process are or include transition metal elements, include one or more selected from titanium (Ti), zirconium (Zr), niobium (Nb), yttrium (Y), chromium (Cr), nickel (Ni), manganese (Mn), molybdenum (Mo), ruthenium (Ru), strontium (Sr), cobalt (Co), and iron (Fe). In some embodiments, the dopants used in the doping process are or include boron (B), silicon (Si), or aluminum (Al). In some embodiments, the material layer 200 includes diamond formed by CVD with in-situ doping using dopants containing Al, Si, Nb, Mn, and/or B. In some embodiments, the material layer 200 includes polycrystalline AlN formed by PVD with dopants added through co-sputtering, and the dopants contain Ti, Zr, Nb, Y, Cr, Ni, Si, Mn, and/or Ru. The formation of the material layer 200 involves performing a deposition process with the reaction temperature lower than 425 degrees Celsius or lower than 400 degrees Celsius to be compatible with BEOL processes, along with doping or implantation to add dopants into the material layer 200.

In some embodiments, the material layer 200 is formed as a crystalline material layer having crystals (grains). In one embodiment, the material layer 200 is formed as a polycrystalline material layer with nano-sized grains (nano grains). In the polycrystalline morphology, grain boundaries appear where grains with different crystalline orientations face each other, and the grain boundaries expand across the structure of the material layer.

FIG. 6 illustrates a portion (zone A encircled by the dashed line in FIG. 4) of the material layer 200 within the semiconductor device structure 10. In some embodiments, referring to FIG. 4 and FIG. 6, the material layer 200 is a grained insulating material layer formed with nano grains CG1, and the dopants Dp are mainly distributed along the grain boundaries GB of the nano grains CG1. In FIG. 4, the dopants Dp are present in the material layer 200 but the dopants that are rather small are not expressly shown in FIG. 4 for simplicity. In certain embodiments, the material layer 200 is formed nano grains CG1 with a grain size (an average grain size) smaller than 50 nm. In one embodiment, the material layer 200 is formed nano grains CG1 with a grain size ranging from about 20 nm to about 30 nm. As the dopants Dp may include transition metal elements or heavy metal atoms, due to the larger volume and the local dangling bonds of the metal elements, dopants Dp tend to distribute at or along grain boundaries GB, as shown in FIG. 6.

Referring to FIG. 5, following the formation of the material layer 200, a cap layer 210 is formed on the material layer 200. In some embodiments, the material of the cap layer 210 includes titanium nitride (TiN), tantalum nitride (TaN), aluminum oxide (e.g. $Al_2O_3$), silicon carbonitride (SiCN), silicon carbide (SiC), or silicon nitride (e.g. $Si_3N_4$). In some embodiments, the material of the material layer 200 is different from the material of the cap layer 210. The cap layer 210 is formed on and all over the top surface of the material layer 200 to protect the material layer 200 from the later processing. In one embodiment, the cap layer 210 is formed with a thickness of about 5 nm to about 10 nm. In some embodiments, the cap layer 210 is formed by CVD such as plasma-enhanced CVD (PECVD).

Referring to FIG. 5, in some embodiments, after the formation of the cap layer 210, an annealing process is performed to the semiconductor device structure 10. In some embodiments, the annealing process includes performing a laser annealing process to heat up and anneal the material layer 200 (FIG. 4) under the protection of the cap layer 210. In some embodiments, the laser annealing process includes applying a laser beam (represented by the sharp cone shown in FIG. 5) directly onto the cap layer 210 of the semiconductor device structure 10 to heat up the underlying material layer 200 to form a nanostructured material layer 201. Compared with tunnel thermal annealing, the laser annealing process is noticeably fast and time-saving.

Referring to FIG. 5, the laser annealing process is performed to the semiconductor device structure 10 along a scanning path, and the scanning path (represented by the meandering arrow shown in FIG. 8) of the laser beam sequentially goes through the multiple die units DU1 of the wafer-form semiconductor device structure 10. In certain embodiments, the laser scanning path has a width ranging from tens to hundreds of microns, and the spans of the laser scanning paths are designed to fully cover the spans of the material layer 200. In one embodiment, the laser annealing process is performed with a pulsed mode laser. In one embodiment, the laser annealing process is performing using a continuous wave laser. Possibly used lasers include carbon dioxide lasers ($CO_2$ lasers), fiber lasers, semiconductor lasers or solid-state lasers (such as neodymium-doped yttrium aluminum garnet (Nd—YAG) lasers, erbium-doped YAG (Er—YAG) lasers), excimer lasers (such as KrF laser), and the wavelength of the laser may range from about 248 nm to about 10 microns.

During the laser annealing process, the material layer 200 is fully heated and annealed to form the nanostructured material layer 201, and through the heat generated by the laser annealing process, the dopants (such as transition metal elements) in the material layer 200 promote atypical and abnormal grain growth upon the heating reaction, and result in the formation of giant grains in the nanostructured material layer 201. That is, with the presence of the dopants and by the use of the annealing treatment (generated heat), the material layer 200 having small nano grains CG1 becomes the nanostructured material layer 201 formed with giant grains CG2. The cap layer 210 functions as a protect layer to guard the surface of the material layer 200 from burnout during the laser treatment. Also, with the presence of the cap layer 210, the defects in the material layer 200 will congregate toward the cap layer 210 upon the heating of the laser annealing process, so that the nanostructured material layer 201 is formed with a reduced surface roughness and less defects.

In certain embodiments, the nanostructured material layer 201 is formed with nano grains CG2 having a grain size (an average grain size) larger than 50 nm. In some embodiments, the nanostructured material layer 201 is formed with giant nano grains CG2 of a grain size at least about twice, or more than twice of the grain size of the nano grains CG1 of the material layer 200 before annealing. In one embodiment, the nanostructured material layer 201 is formed with giant nano grains CG2 having a lateral grain size larger than 50 nm and a vertical grain size larger than about 80 nm. After the laser annealing process, the dopants Dp tend to distribute at or along grain boundaries GB of the giant nano grains CG2, as shown in FIG. 7.

Figure 9:
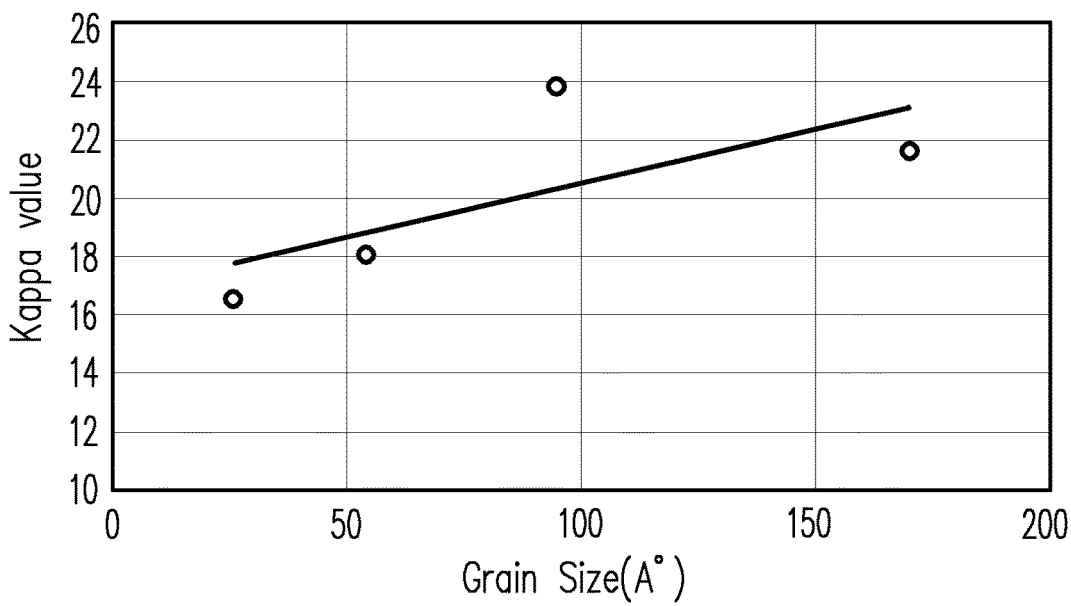
FIG. 9 is a diagram showing the relationship of thermal conductivity versus grain size(s) of the material layer.

FIG. 9 is a diagram showing the relationship of thermal conductivity versus grain size(s) of the material layer. The thermal conductivity of a material is a measure of its ability to conduct heat, and it is commonly denoted by k-value or kappa value and is measured in W/m·K. As seen in FIG. 9, it is evident that there is a linear relationship between the thermal conductivity (kappa value in W/m·K) and grain sizes (in angstroms, A°) of the material layer. As mentioned earlier, the nanostructured material layer 201 obtained after the treatment of laser annealing has nano grains CG2 of a grain size at least about twice, or more than twice of the grain size of the nano grains CG1 of the material layer 200 before annealing. Through the reaction the ultrafast annealing process, the small-grained insulating material layer 200 becomes the large-grained insulating material layer 201, which has high thermal conductivity and functions as a heat transfer layer.

Based on the extrapolation and simulation results, compared with the material layer 200, the thermal conductivity (or the kappa value) of the nanostructured material layer 201 is at least twice or even higher than that of the material layer 200 without annealing. The thermal conductivity of a thin film of a material layer is measured in the directions parallel and perpendicular to the film surface as in-plane kappa value and out-of-plane kappa value, respectively. For example, a deposited layer of aluminum nitride (AlN) is formed with dopants as described in the previous paragraphs, the AlN layer before annealing is formed with a lateral grain size of about 20 nm and the in-plane kappa value of about 20-24 W/m·K, and after annealing, the AlN layer has a lateral grain size larger than 50 nm, the in-plane kappa value larger than 80 W/m·K, a vertical grain size about or larger than 80 nm and the out-of-plane kappa value ranging from about 100-300 W/m·K. Compared with the low-k dielectric material having a low thermal conductivity of about 0.3 W/m·K, the nanostructured material layer 201 has a very high thermal conductivity, about 100 times to 500 times higher, which leads to a much lower thermal resistance of the nanostructured material layer 201 and much better heat transferring effects and heat dissipating performance. Compared the nanostructured material layer 201 with the untreated material layer 200 (without annealing), the nanostructured material layer 201 has a grain size at least twice or larger, and the thermal resistance is reduced at least 50% through the laser annealing treatment. In some embodiments, the nanostructured material layer 201 has grain sizes larger than 50 nm and the increased thermal conductivity at least four times higher than the untreated material layer 200. For the nanostructured material layer 201 having giant grains, the much lower volume fractions of grain boundaries result in better time-dependent dielectric breakdown (TDDB) or breakdown voltage (Vbd) for the nanostructured material layer 201, which attributes to lower leakage characteristics and better device performance.

Referring to FIG. 10, in Step S10 and referring to FIG. 1, the semiconductor device structure 10 including a device layer 103 is formed through front-end-of-line (FEOL) processes for wafer fabrication. Later, in Step 12 and referring to FIG. 1 and FIG. 2, a connection tier 105 is formed on the semiconductor device structure 10 through middle-end-of-line (MEOL) processes, and in Step 14, an interconnection tier 107 is formed on the connection tier 105 over the semiconductor device structure 10 through the back-end-of-line (BEOL) processes. In Step S16 and referring to FIG. 3, a backside thinning process is performed to the semiconductor device structure 10. In Step S18 and referring to FIG. 4, a material layer 200 is formed with dopants Dp therein on the backside of the semiconductor device structure 10. In Step S20 and referring to FIG. 5, a cap layer 210 is formed on and covering the material layer 200. In Step S22 and referring to FIG. 5, an annealing process is performed to form a nanostructured material layer 201 (heat transfer layer). By way of applying the annealing process to the cap layer 210 and the material layer 200 (FIG. 4), the material layer 200 becomes the nanostructured material layer 201.

Figure 11:
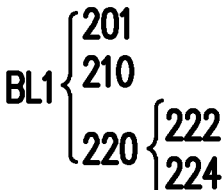
FIGS. 11-13 are schematic cross-sectional views of exemplary structures of the semiconductor device structure according to some embodiments of the present disclosure.
Figure 12:
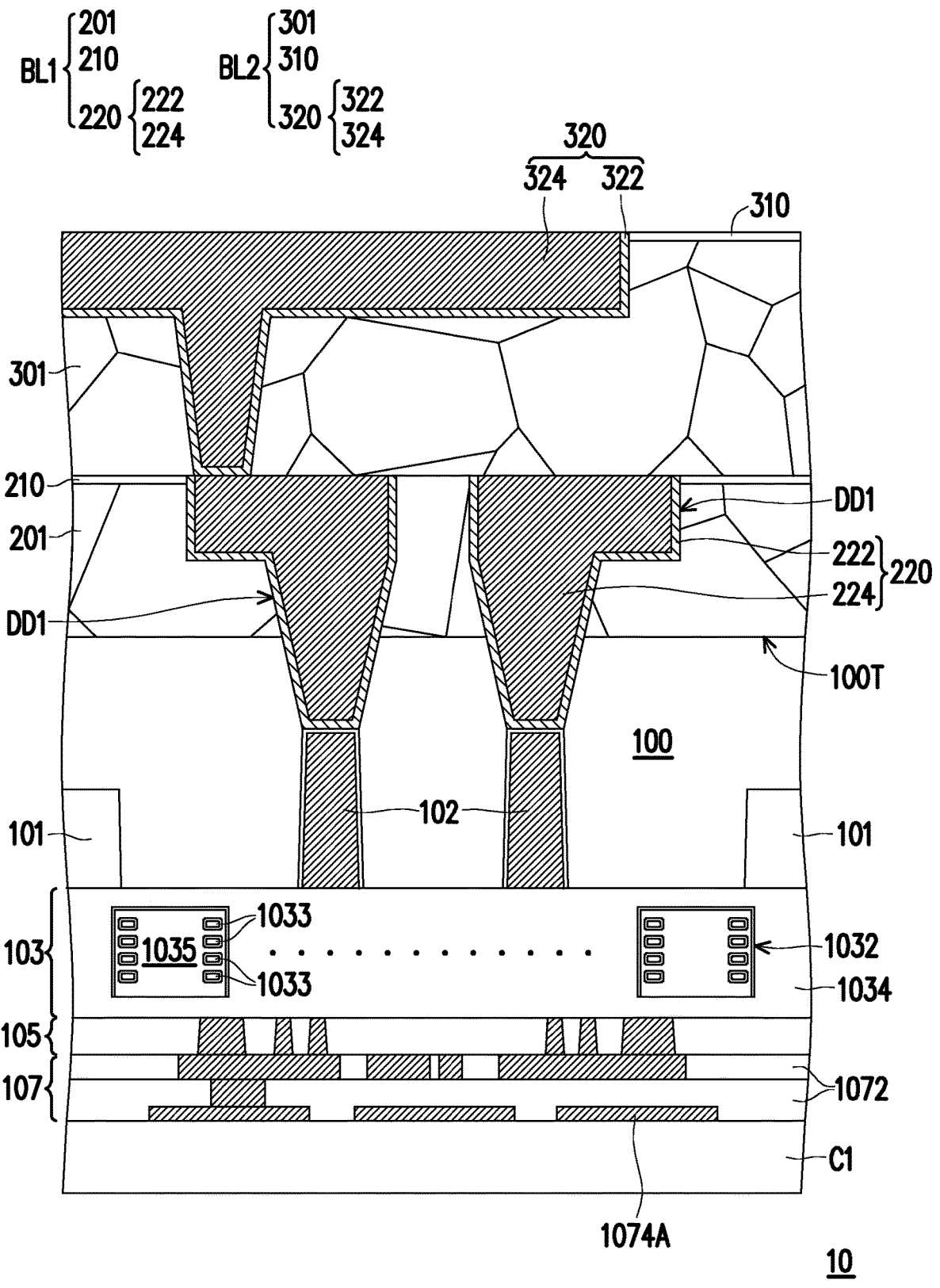
Figure 13:
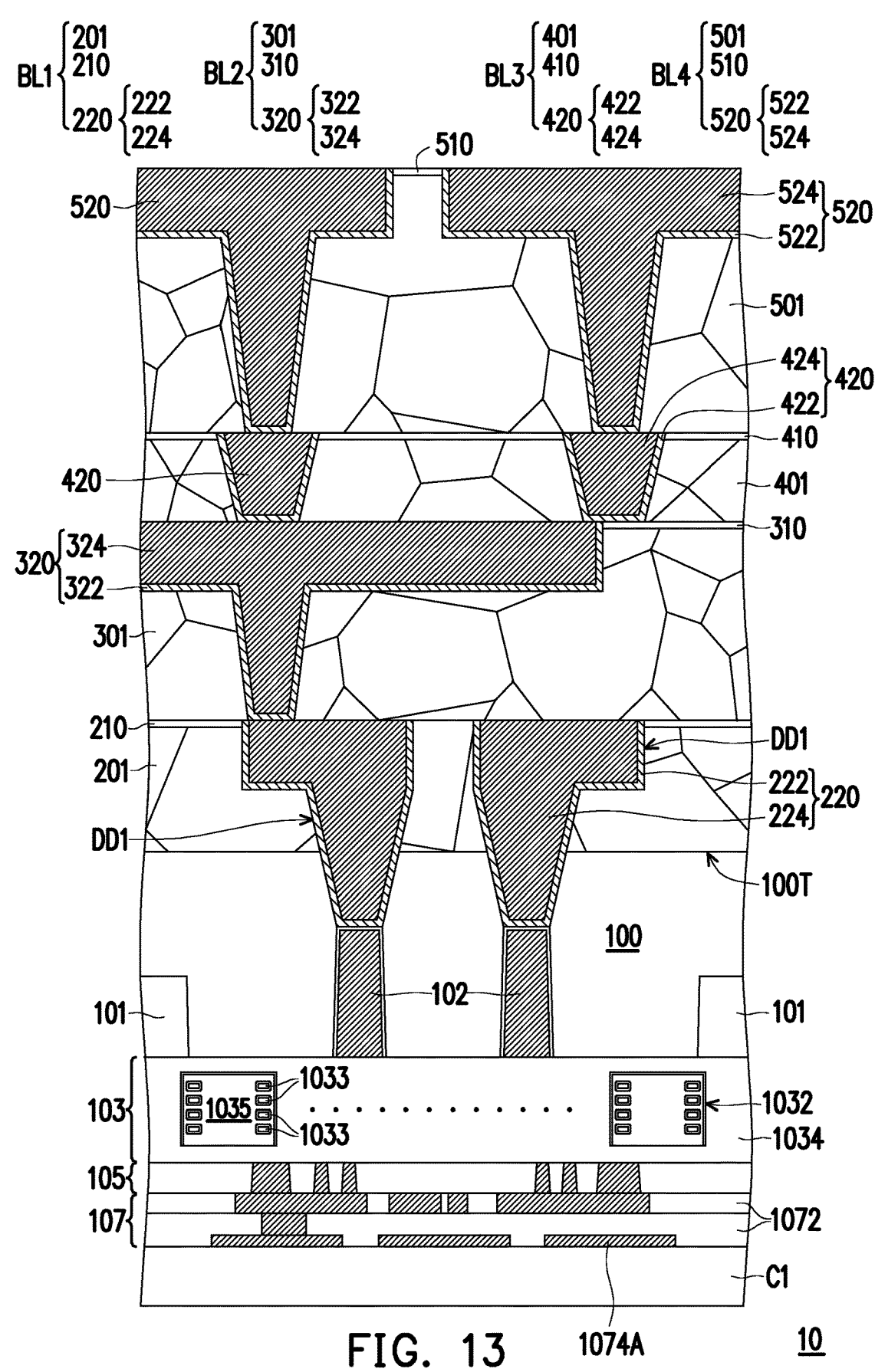

FIGS. 11-13 are schematic cross-sectional views of exemplary structures of the semiconductor device structure according to some embodiments of the present disclosure.

Following the formation of the material layer 200 and the nanostructured material layer 201 as described in FIG. 4 and FIG. 5, the semiconductor device structure 10 is formed with the heat transfer layer 201 (the aforementioned nanostructured material layer 201) and the cap layer 210 remained on the heat transfer layer 201 formed on the semiconductor substrate 100. Referring to FIG. 11, in some embodiments, first backside metallization structures 220 are formed within the heat transfer layer 201 in the semiconductor device structure 10. The formation of the first backside metallization structures 220 involves forming damascene openings DD1 penetrating through the cap layer 210, through the heat transfer layer 201 and extending into the semiconductor substrate 100 to expose the conductive through vias 102 by way of the dual damascene formation processes, and forming liner patterns 222 and metallic base patterns 224 inside the dual damascene openings DD1 and filling up the dual damascene openings DD1.

As seen in FIG. 11, the dual damascene openings DD1 extend from the top surface of the cap layer 210 to the top surface of the through vias 102 so that the through vias 102 are exposed by forming the dual damascene openings DD1. In some embodiments, the formation of the dual damascene openings DD1 involves forming masking patterns (not shown) on the cap layer 210 and the heat transfer layer 201, and sequentially etching the cap layer 210 and the heat transfer layer 201 to form trench openings and via openings of the dual damascene openings DD1. In some embodiments, the formation of the dual damascene openings DD1 involves one or more etching processes, and the etching process may include a dry etching process, a wet etching process, a RIE process, other suitable methods, or combinations thereof. In some embodiments, the etching process includes multiple etching steps with different etching chemistries, designed for etching selectivity to form openings having a desired profile. It is understood that the dual damascene processing described herein is merely exemplary, and the opening(s) and the bonding structures formed within the openings may be formed through suitable formation process(es) for forming trenches, damascenes, via openings or other openings with suitable configurations.

Referring to FIG. 11, in some embodiments, the formation of the liner patterns 222 and metallic base patterns 224 involves forming a liner/barrier layer (not shown) over the heat transfer layer 201 and conformally covering the dual damascene openings DD1, forming a metallic material layer (not shown) over the liner/barrier layer filling into the dual damascene openings DD1 (filling up the dual damascene openings DD1), and performing a removal process partially removing the liner/barrier layer outside the dual damascene openings DD1 to form the liner patterns 222 and partially removing the metallic material layer to form metallic base patterns 224 inside the dual damascene openings DD1. In some embodiments, the removal process includes performing an etching back process, or a chemical mechanical polishing (CMP) process, or a combination thereof to remove the extra liner layer and the extra metallic material layer outside the dual damascene openings DD1. As seen in FIG. 11, in some embodiments, after performing the removal process, the cap layer 210 may be partially removed and partially remained without exposing the underlying heat transfer layer 201.

In some embodiments, in FIG. 11, within the dual damascene openings DD1, the first backside metallization structures 220 including the liner patterns 222 and the metallic base patterns 224 are formed. As the liner/barrier layer and the metallic material layer outside the dual damascene openings DD1 or higher than the top surface of the heat transfer layer 201 are removed, the tops of the metallic base pattern(s) 224 and the tops of the liner pattern(s) 1063 are substantially levelled with the top surface of the heat transfer layer 201 in FIG. 11. Herein, the first backside metallization structures or features may include other configurations and may include one or more through vias and/or damascene structures.

In some embodiments, as seen in FIG. 11, the first backside metallization structures 220 formed in the dual damascene opening(s) DD1 are in direct contact with and are physically and electrically connected to the conductive through vias 102. In some embodiments, because the through vias 102 buried in the semiconductor substrate 100 are considered as backside vias that are electrically connected with the transistors 1032, the first backside metallization structures 220 are electrically connected with the transistors 1032 through the through vias 102, and function as part of the backside electrical connection structure of the transistors 1032 (or the device layer 103).

Herein, the first backside metallization structures 220, the remained cap layer 210 and the heat transfer layer 201 form the first backside layer BL1.

In some embodiments, the material of the liner/barrier layer or the liner pattern 222 includes titanium (Ti), tantalum (Ta), manganese (Mn), niobium (Nb), vanadium (V), yttrium (Y), nitrides thereof or combinations thereof. In some embodiments, the liner/barrier layer is formed with a thickness ranging from about 10 angstroms to about 100 angstroms. In some embodiments, the liner pattern 222 includes a composite layer of titanium/titanium nitride (Ti/TiN), or a composite layer of tantalum/tantalum nitride (Ta/TaN). In some embodiments, the material of the metallic material layer or the metallic base patterns 224 includes one or more metals of W, Cu, Co, Ni, Al, rhodium (Rh), iridium (Ir), ruthenium (Ru), molybdenum (Mo), osmium (Os), silver (Ag), and gold (Au) or one or more metal alloys of aluminum-copper alloys (AlCu), nickel-aluminum alloys (NiAl), ruthenium-aluminum alloys (RuAl), vanadium-nickel alloys (VNi), vanadium-platinum alloys (VPt), aluminum-scandium alloys (AlSc), or combinations thereof. The formation of the metallic material layer involves electrochemical plating (ECP), electroless deposition (ELD), deposition including CVD, PVD, ion beam deposition (IBD), atomic layer deposition (ALD) or other suitable process such as molecular beam epitaxy (MBE).

Referring to FIG. 12, the second backside layer BL2 is formed on the first backside layer BL1, following similar manufacturing process steps, methods and using similar or the same materials as described for the first backside layer BL1. In FIG. 12, in some embodiments, the formation of the second backside layer BL2 involves forming a second heat transfer layer 301 and forming second backside metallization structures 320 in the second heat transfer layer 301. The second heat transfer layer 301 is a nanostructured insulating material layer having large-sized nano grains and high thermal conductivity. Similarly, the second heat transfer layer 301 is formed through the same or similar process steps S18-S22 for forming the first heat transfer layer 201. In some embodiments, the second heat transfer layer 301 is formed by forming a second material layer with dopants (not shown) on the cap layer 210 and on the first backside metallization structures 220, forming a second cap layer 310 on the second material layer, then performing an annealing process to turn the second material layer containing dopants into a second heat transfer layer 301 (nanostructured material layer). In some embodiments, the second material layer is formed with dopants by performing a deposition process along with a doping process either sequentially or simultaneously. In some embodiments, the second heat transfer layer 301 includes an insulating material formed with large or giant grains (nano grains) and having dopants distributed along grain boundaries of the nano grains. In one embodiment, the second heat transfer layer 301 is formed with giant nano grains having a lateral grain size larger than about 50 nm. In one embodiment, the second heat transfer layer 301 is formed with giant nano grains having a lateral grain size larger than about 50 nm and a vertical grain size larger than about 80 nm. Similarly, the second heat transfer layer 301 is formed following the same or similar materials and methods as described in the previous paragraphs for the first heat transfer layer 201. In some embodiments, the second backside metallization structures 320 including liner patterns 322 and the metallic base patterns 324 are formed, and the second backside metallization structures 320 may be formed through the same or similar process steps used for the formation of the first backside metallization structures 220.

In some embodiments, the insulating material of the second heat transfer layer 301 includes diamond, crystalline (polycrystalline or monocrystalline) aluminum nitride (AlN), crystalline silicon carbide (SiC), and crystalline boron nitride (BN). In some embodiments, the materials of the first and second heat transfer layers 201, 301 are substantially the same. In some embodiments, the material of the second heat transfer layer 301 is different from the material of the heat transfer layer 201. Depending on the insulating material of the first or second heat transfer layers 201, 301, different dopants may be used for assisting the formation of large nano grains in the nanostructured material layer upon the laser annealing process. In some embodiments, the materials of the first cap layer 210 and the second cap layer 310 are the same. In some embodiments, the materials of the first cap layer 210 and the second cap layer 310 are different. In some embodiments, the second backside metallization structures 320 are formed using the same or similar materials and methods used for the first backside metallization structures 220.

In some embodiments, as seen in FIG. 12, the second backside metallization structures 320 are physically and electrically connected to the first backside metallization structures 220. In some embodiments, through the first backside metallization structures 220 and the through vias 102 buried in the semiconductor substrate 100, the second backside metallization structures 320 are electrically connected with the transistors 1032, and function as part of the backside electrical connection structure for the transistors 1032 (or the device layer 103). Herein, it is possible that the second backside metallization structures or features may include other configurations and may include one or more connection lines, traces, through vias and/or damascene structures.

Referring to FIG. 13, the third backside layer BL3 and the fourth backside layer BL4 are sequentially formed on the second backside layer BL2 and the first backside layer BL1. The first and second backside layers BL1-BL2 that are located closer to the semiconductor substrate 100 may be referred to as lower backside layers, while the third and fourth backside layers BL3-BL4 that are located farther away from the semiconductor substrate 100 may be referred to as higher backside layers. It is understood that the third and fourth backside layers BL3 and BL4 are formed following similar manufacturing process steps, methods and using similar or the same materials as described for the previously formed backside layers BL1 or BL2. In FIG. 13, in some embodiments, the third backside layer BL3 includes a third heat transfer layer 401 and a third cap layer 410 covering the third heat transfer layer 401, and third backside metallization structures 420 including liner patterns 422 and metallic base patterns 424 embedded in the heat transfer layer 401. In FIG. 13, in some embodiments, the fourth backside layer BL4 includes a fourth heat transfer layer 501 and a fourth cap layer 510 covering the heat transfer layer

501, and fourth backside metallization structures 520 including liner patterns 522 and metallic base patterns 524 embedded in the heat transfer layer 501. In some embodiments, the heat transfer layers 401 and 501 are individually and respectively nanostructured insulating material layers having large-sized nano grains and high thermal conductivity. Similarly, the heat transfer layer 401 or 501 is formed through the same or similar process steps S18-S22 as aforementioned, and such formation involves performing a deposition process along with a doping process either sequentially or simultaneously. In some embodiments, the heat transfer layer 401 or 501 includes an insulating material formed with large or giant grains (nano grains) and having dopants distributed along grain boundaries of the nano grains. In one embodiment, the third heat transfer layer 401 is formed with giant nano grains having a lateral grain size larger than about 50 nm. In one embodiment, the fourth heat transfer layer 501 is formed with giant nano grains having a lateral grain size larger than about 50 nm and optionally a vertical grain size larger than about 80 nm.

In some embodiments, the insulating material of the heat transfer layer 401 or 501 includes diamond, crystalline (polycrystalline or monocrystalline) aluminum nitride (AlN), crystalline silicon carbide (SiC), and crystalline boron nitride (BN). In some embodiments, the materials of the heat transfer layers 401 and 501 are substantially the same. In some embodiments, the material of the heat transfer layer 401 and the material of the heat transfer layer 501 are different. In some embodiments, the materials of the heat transfer layers 401 and 501 are different from the material of the heat transfer layer 301 or 201. The heat transfer layers 401 and 501 may include dopants different from those contained in the first or second heat transfer layers 201, 301, leading to different average grain sizes of the nano grains in the nanostructured insulating material of the heat transfer layers 401 or 501. In some embodiments, the materials of the cap layers 410 and 510 are the same. In some embodiments, the materials of the cap layers 410 and 510 are different. In some embodiments, the third backside metallization structures 420 are formed using the same or similar materials and methods used for the lower backside metallization structures, but the fourth backside metallization structures 520 are formed using the same or similar materials and methods used for the lower backside metallization structures.

In some embodiments, as seen in FIG. 13, the third backside metallization structures 420 are physically and electrically connected to the second backside metallization structures 320, and the fourth backside metallization structures 520 are physically and electrically connected to the third backside metallization structures 420. In some embodiments, the third backside metallization structures 420 include power deliver network with configurations such as through vias, connection lines, traces, and/or damascene structures. In some embodiments, the fourth backside metallization structures 520 includes backside power rails (BPRs) with configurations such as rail lines, traces, and/or damascene structures. In some embodiments, through the lower backside metallization structures 220, 320 and the through vias 102 buried in the semiconductor substrate 100, the third and fourth backside metallization structures 420 and 520 work together to deliver power to the below device layer 103, and the third and fourth backside metallization structures 420 and 520 that are electrically connected with the transistors 1032 function as part of the backside electrical connection structure as well.

Referring to FIG. 13, the backside layers BL1, BL2, BL3 and BL4 form the backside connection structures to provide electrical connection and deliver power to the underlying device layer 103. Further, the backside connection structures also include heat transfer layers 201, 301, 401, 501 as the backside heat transfer structures for assisting the heat dissipation for the backside connection structures, especially for efficiently transferring heat from backside power rails or other power delivery network. It is understood that the number of the backside layers or the heat transfer layers is merely exemplary. The backside layers or heat transfer layers are not limited to four layers as illustrated in the context but more layers or less layer(s) may be included to form the backside connection structures or the backside heat transfer structures.

In some embodiments, the heat transfer layer 401 has a lateral grain size larger than 50 nm and a kappa value larger than 80 W/m·K. In some embodiments, the heat transfer layer 501 has a lateral grain size larger than 50 nm and a kappa value larger than 80 W/m·K. In one embodiment, the heat transfer layer 501 has a grain size about or larger than 80 nm, and a kappa value ranging from about 100-300 W/m·K.

In some embodiments, the materials of the heat transfer layers 401 and 501 are different from the material of the heat transfer layer 301 or 201. In some embodiments, the formation of the heat transfer layer 401 or 501 includes forming a diamond layer by CVD with in-situ doping using dopants containing Al, Si, Nb, Mn, and/or B, and then performing a laser annealing process to promote the growth of giant grains in the diamond layer. In some embodiments, the formation of the heat transfer layer 301 or 201 includes forming a crystalline AlN layer by PVD with dopants added through co-sputtering, and the dopants contain Ti, Zr, Nb, Y, Cr, Ni, Si, Mn, and/or Ru, and then performing a laser annealing process to promote the growth of giant grains in the AlN layer.

In some embodiments, the heat transfer layers 401 and 501 are formed from the same or similar material(s) for forming the heat transfer layer 301 or 201, but the heat transfer layer 401 or 501 is formed with nano grains having grain sizes larger than the grain size of the nano grains of the heat transfer layer 301 or 201, and the heat transfer layer 401 or 501 has a thermal conductivity higher than the heat transfer layer 301 or 201.

In some embodiments, the heat transfer layer 401 or 501 has a thermal conductivity higher than the heat transfer layer 301 or 201, further promoting the heat transferring from the hot spots (such as power rails or power delivery network) to other sites within the device structure.

By incorporating heat transfer layers of high thermal conductivity in the backside connection structure, especially nanostructured dielectric material layers with large grain sizes and high thermal conductivity near the backside power rails, highly efficient heat dissipation scheme is established. Based on simulation results, the maximum temperature (Tmax) expected at the hot spots near backside power rails is lowered by about 40%. By avoiding possible degradation caused by the high Tmax, the reliability and performance of the semiconductor device structure are significantly improved.

Further, through the ultrafast laser anneal process used for forming nanostructured dielectric material layers with large grain sizes and high thermal conductivity, the high quality nanostructured material layer of high thermal conductivity can be formed under the BEOL compatible temperatures (such as 400 degrees Celsius), and such processes may be easily integrated into the manufacturing processes of the backside connection structures including backside power rails.

In accordance with some embodiments of the present disclosure, a semiconductor device structure is disclosed. The structure includes a semiconductor substrate having a first surface and a second surface opposite to the first surface, and a device layer disposed on the first surface of the semiconductor substrate. The device layer includes a plurality of transistors. The structure includes backside connection structures that are disposed on the second surface of the semiconductor substrate and electrically connected with the plurality of transistors. The backside connection structures include heat transfer layers stacked upon one another and backside metallization structures sandwiched between the heat transfer layers. At least one heat transfer layer of the heat transfer layers includes an insulating nanostructured material having nano grains and dopants distributed along grain boundaries of the nano grains.

In accordance with some embodiments of the present disclosure, a manufacturing method for a semiconductor device structure is disclosed. A device layer is formed on a first surface of a semiconductor substrate, and the device layer is formed with a plurality of transistors. A thinning process is performed to the semiconductor substrate, thinning the semiconductor substrate from a second surface of the semiconductor substrate opposite to the first surface. A material layer containing dopants is formed on the second surface of the thinned semiconductor substrate. The material layer is formed with first nano grains of a first grain size. A cap layer is formed on the material layer covering the material layer. An annealing process is performed to the cap layer and the material layer to turn the material layer into a nanostructured material layer. The nanostructured material layer is formed with second nano grains of a second grain size, and the second grain size is larger than the first grain size. Metallization structures are formed in the nanostructured material layer.

In accordance with some embodiments of the present disclosure, a manufacturing method of a semiconductor device structure is disclosed. A semiconductor substrate having through vias embedded therein is provided. A device layer is formed on a first surface of the semiconductor substrate, and the device layer is formed with a plurality of transistors. A first material layer is formed on a second surface of the semiconductor substrate opposite to the first surface and doping is performed to the first material layer. The first material layer is formed with first nano grains of a first grain size and contains first dopants. A first cap layer is formed on the first material layer covering the first material layer. A first nanostructured material layer is formed below the first cap layer by performing a first laser annealing process, and the first nanostructured material layer is formed with second nano grains of a second grain size that is larger than the first grain size, and the first dopants are distributed along grain boundaries of the second nano grains. First metallization structures are formed in the first nanostructured material layer. A second material layer is formed over the first material layer and doping is performed to the second material layer. The second material layer is formed with third nano grains of a third grain size and contains second dopants. A second cap layer is formed on the second material layer covering the second material layer. A second nanostructured material layer is formed below the second cap layer by performing a second laser annealing process, and the second material layer is formed with fourth nano grains of a fourth grain size that is larger than the third grain size, and the second dopants are distributed along grain boundaries of the fourth nano grains. Second metallization structures are formed in the second nanostructured material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor device structure, comprising:
   forming a device layer on a first surface of a semiconductor substrate, wherein the device layer is formed with a plurality of transistors;
   performing a thinning process to the semiconductor substrate, thinning the semiconductor substrate from a second surface of the semiconductor substrate opposite to the first surface;
   forming a material layer containing dopants on the second surface of the thinned semiconductor substrate, wherein the material layer is formed with first nano grains of a first grain size;
   forming a cap layer on the material layer covering the material layer;
   performing an annealing process to the cap layer and the material layer to turn the material layer into a nanostructured material layer, wherein the nanostructured material layer is formed with second nano grains of a second grain size, and the second grain size is larger than the first grain size; and
   forming metallization structures in the nanostructured material layer.

2. The method as claimed in claim 1, wherein forming a material layer containing dopants includes performing a deposition process and performing in-situ doping of the dopants.

3. The method as claimed in claim 2, wherein forming the material layer includes depositing a layer of an insulating material selected from diamond, crystalline aluminum nitride (AlN), crystalline silicon carbide (SiC), or crystalline boron nitride (BN).

4. The method as claimed in claim 3, wherein the dopants include at least one selected from boron (B), silicon (Si), aluminum (Al), titanium (Ti), zirconium (Zr), niobium (Nb), yttrium (Y), chromium (Cr), nickel (Ni), manganese (Mn), molybdenum (Mo), ruthenium (Ru), strontium (Sr), cobalt (Co), or iron (Fe).

5. The method as claimed in claim 1, wherein forming the material layer with dopants includes forming a diamond layer by performing a chemical vapor deposition process with in-situ doping.

6. The method as claimed in claim 5, wherein the dopants include at least one element selected from Al, Si, Nb, Mn, B, or combinations thereof.

7. The method as claimed in claim 1, wherein forming the material layer with dopants includes forming a crystalline AlN layer by performing a physical vapor deposition process and co-sputtering the dopants.

8. The method as claimed in claim 7, wherein the dopants include at least one element selected from Ti, Zr, Nb, Y, Cr, Ni, Si, Mn, Ru or combinations thereof.

9. The method as claimed in claim 1, wherein forming metallization structures in the nanostructured material layer includes forming metallic power rails in the nanostructured material layer.

10. A manufacturing method of a semiconductor device structure, comprising:
   providing a semiconductor substrate having through vias embedded therein;
   forming a device layer on a first side of the semiconductor substrate, wherein the device layer is formed with a plurality of transistors;
   forming a first material layer on a second side of the semiconductor substrate opposite to the first side and performing doping to the first material layer, wherein the first material layer is formed with first nano grains of a first grain size and contains first dopants;
   forming a first cap layer on the first material layer covering the first material layer;
   forming a first nanostructured material layer below the first cap layer by performing a first laser annealing process, wherein the first nanostructured material layer is formed with second nano grains of a second grain size that is larger than the first grain size, and the first dopants are distributed along grain boundaries of the second nano grains;
   forming first metallization structures in the first nanostructured material layer;
   forming a second material layer over the first material layer and performing doping to the second material layer, wherein the second material layer is formed with third nano grains of a third grain size and contains second dopants;
   forming a second cap layer on the second material layer covering the second material layer;
   forming a second nanostructured material layer below the second cap layer by performing a second laser annealing process, wherein the second material layer is formed with fourth nano grains of a fourth grain size that is larger than the third grain size, and the second dopants are distributed along grain boundaries of the fourth nano grains; and
   forming second metallization structures in the second nanostructured material layer.

11. The method as claimed in claim 10, wherein forming first metallization structures in the first nanostructured material layer includes forming connection patterns in the first nanostructured material layer, and the connection patterns are connected with the through vias and are electrically connected with the plurality of transistors.

12. The method as claimed in claim 11, wherein forming second metallization structures in the second nanostructured material layer includes forming metallic power rails in the second nanostructured material layer, and the metallic power rails are electrically connected with the first metallization structures and the plurality of transistors.

13. The method as claimed in claim 12, wherein the fourth grain size is different to the second grain size, and the second nanostructured material layer has a thermal conductivity higher than that of the first nanostructured material layer.

14. The method as claimed in claim 10, wherein materials of the first nanostructured material layer and the second nanostructured material layer include insulating materials selected from diamond, crystalline aluminum nitride (AlN), crystalline silicon carbide (SiC), or crystalline boron nitride (BN).

15. The method as claimed in claim 14, wherein the first dopants and the second dopants include at least one selected from boron (B), silicon (Si), aluminum (Al), titanium (Ti), zirconium (Zr), niobium (Nb), yttrium (Y), chromium (Cr), nickel (Ni), manganese (Mn), molybdenum (Mo), ruthenium (Ru), strontium (Sr), cobalt (Co), or iron (Fe).

16. A semiconductor device structure, comprising:

a semiconductor substrate having a first surface and a second surface opposite to the first surface;

a device layer disposed on the first surface of the semiconductor substrate, wherein the device layer includes a plurality of transistors; and backside connection structures, disposed on the second surface of the semiconductor substrate and electrically connected with the plurality of transistors, wherein the backside connection structures include backside metallization structures and at least one insulating nanostructured material having nano grains and dopants distributed along grain boundaries of the nano grains.

17. The structure as claimed in claim 16, wherein the nano grains have an average grain size larger than 50 nm.

18. The structure as claimed in claim 17, wherein the insulating nanostructured material includes diamond, crystalline aluminum nitride (AlN), crystalline silicon carbide (SiC), or crystalline boron nitride (BN).

19. The structure as claimed in claim 18, wherein the dopants include at least one selected from boron (B), silicon (Si), aluminum (Al), titanium (Ti), zirconium (Zr), niobium (Nb), yttrium (Y), chromium (Cr), nickel (Ni), manganese (Mn), molybdenum (Mo), ruthenium (Ru), strontium (Sr), cobalt (Co), or iron (Fe).

20. The structure as claimed in claim 16, wherein the backside metallization structures include metallic backside power rails.

* * * * *